United States Patent
Gord et al.

(10) Patent No.: US 11,177,622 B1
(45) Date of Patent: Nov. 16, 2021

(54) NEARLY TRANSFORM-LIMITED, LOW-REPETITION-RATE, PICOSECOND OPTICAL PARAMETRIC GENERATOR

(75) Inventors: James R. Gord, Dayton, OH (US); Paul S Hsu, Dayton, OH (US); Sukesh Roy, Beavercreek, OH (US)

(73) Assignee: United States of America as represented by the Secretary of the Air Force, Wright-Patterson AFB, OH (US)

(*) Notice: Subject to any disclaimer, the term of this patent is extended or adjusted under 35 U.S.C. 154(b) by 2469 days.

(21) Appl. No.: 13/555,198

(22) Filed: Jul. 23, 2012

Related U.S. Application Data

(63) Continuation-in-part of application No. 12/956,499, filed on Nov. 30, 2010, now abandoned.

(60) Provisional application No. 61/264,877, filed on Nov. 30, 2009.

(51) Int. Cl.
| | |
|---|---|
| *H01S 3/10* | (2006.01) |
| *H01S 3/108* | (2006.01) |
| *H01S 3/08* | (2006.01) |
| *H01S 3/213* | (2006.01) |
| *G02F 1/39* | (2006.01) |
| *H01S 3/11* | (2006.01) |

(52) U.S. Cl.
CPC ......... *H01S 3/1083* (2013.01); *H01S 3/0805* (2013.01); *H01S 3/10007* (2013.01); *H01S 3/10023* (2013.01); *H01S 3/10084* (2013.01); *H01S 3/213* (2013.01); *G02F 1/392* (2021.01); *H01S 3/11* (2013.01)

(58) Field of Classification Search
CPC .... H01S 3/1083; H01S 3/10084; H01S 3/213; H01S 3/0805; H01S 3/10023; H01S 3/10007; H01S 3/11
See application file for complete search history.

(56) References Cited

U.S. PATENT DOCUMENTS

| | | | |
|---|---|---|---|
| 8,605,760 B2* | 12/2013 | Liang | H01S 5/142 372/18 |
| 2013/0301117 A1* | 11/2013 | Zapata | H01S 3/0604 359/342 |
| 2016/0139266 A1* | 5/2016 | Montoya | G01S 17/32 356/5.01 |
| 2019/0183346 A1* | 6/2019 | Islam | G01N 33/15 |
| 2021/0239707 A1* | 8/2021 | Loboda | G01N 1/4022 |

* cited by examiner

*Primary Examiner* — Kinam Park
(74) *Attorney, Agent, or Firm* — AFMCLO/JAZ; Chastity D. S. Whitaker

(57) ABSTRACT

A low-repetition-rate (10-Hz), picosecond (ps) optical parametric generator (OPG) system produces higher energy output levels in a more robust and reliable system than previously available. A picosecond OPG stage is seeded at an idler wavelength with a high-power diode laser and its output at ~566 nm is amplified in a pulsed dye amplifier (PDA) stage having two dye cells, resulting in signal enhancement by more than three orders of magnitude. The nearly transform-limited beam at ~566 nm has a pulse width of ~170 ps with an overall output of ~2.3 mJ/pulse. A spatial filter between the OPG and PDA stages and a pinhole between the two dye cells improve high output beam quality and enhances coarse and fine wavelength tuning capability.

1 Claim, 4 Drawing Sheets

NEARLY TRANSFORM-LIMITED, LOW-REPETITION-RATE, PICOSECOND OPTICAL PARAMETRIC GENERATOR

CROSS REFERENCE TO RELATED PATENT APPLICATION

This application is a continuation in part of application Ser. No. 12/956,499, filed Nov. 30, 2010, titled "Nearly Transform-Limited, Low-Repetition-Rate, Picosecond Optical Parametric Generator," now abandoned, and claims priority under 35 U.S.C. § 120 from that application, which in turn claimed priority under 35 U.S.C. § 119(e) from U.S. provisional application Ser. No. 61/264,877, filed Nov. 30, 2009, titled "Development of a Nearly Transform-Limited, Low-Repetition-Rate, Picosecond Optical Parametric Generator." The invention descriptions contained in both previous patent applications are incorporated by reference into this description.

RIGHTS OF THE GOVERNMENT

The invention described herein may be manufactured and used by or for the Government of the United States for all governmental purposes without the payment of any royalty.

BACKGROUND OF THE INVENTION

The present invention relates generally to very short pulse lasers, and more specifically to a tunable picosecond (ps) optical parametric generator-based system able to produce a nearly transform-limited picosecond signal of high signal strength.

The application of tunable picosecond lasers for high-resolution linear and nonlinear spectroscopic techniques, such as laser-induced fluorescence, polarization spectroscopy and electronic-resonance-enhanced coherent anti-Stokes Raman scattering spectroscopy, requires high energy output with a nearly transform-limited bandwidth.

A transform-limited, or bandwidth-limited, pulse is a pulse of a wave that has the minimum possible duration for a given spectral bandwidth.

Tunable picosecond lasers with moderate (<10 GHz) spectral resolution enable spectral resolution of closely lying vibrational levels, provide high temporal resolution for studying of fast dynamics in high-temperature and high-pressure conditions, and improve signal-to-noise ratio in coherent anti-Stokes Raman scattering (CARS) through suppression of nonresonant background. Furthermore, use of short-pulse lasers enables efficient nonlinear processes with low pulse energy below a material-damage threshold, making it possible to deliver laser beams through fiber optics in harsh environments.

It is advantageous for laser sources to be widely tunable so that broad spectral ranges can be covered for spectroscopic applications. For example, such picosecond laser-based spectroscopic techniques can be used for detecting the temperature and concentration of OH, CH, NO and other molecules in reacting flows.

Unfortunately, unlike parametric processes employing longer pulse nanosecond (ns) lasers where parametric gain can be enhanced by multiple round-trip interactions in a laser gain medium, in a low-repetition-rate picosecond optical parametric generator (OPG), parametric gain is limited to a single-pass interaction because of the short interaction time of the laser pulse with the nonlinear medium. For such a picosecond OPG, line-narrowing must be accomplished during the single-pass interaction time. Prior art tunable picosecond optical parametric amplifiers (OPA) are generally characterized by low-output pulse energy (~100 μJ) and broad spectral width (>300 GHz).

Several high-output pulse energy (~1 mJ/pulse) picosecond OPA systems are commercially available, but their spectral width is typically >120 GHz.

State-of-the-art prior art tunable picosecond laser systems based on a Nd:YAG-pumped distributed-feedback dye laser (DFDL) can provide nearly transform-limited pulses (~5 GHz) of 100 ps duration at a repetition rate of 20 Hz. However, DFDL-based tunable picosecond laser systems use interference patterns created by Bragg gratings and are, therefore, overly sensitive to mechanical disturbances such as vibration and temperature changes and require very sophisticated alignment and maintenance.

It is seen, therefore, that there is a need for a robust and reliable high energy output picosecond laser system for use in laser spectroscopy.

SUMMARY OF THE INVENTION

The present invention provides a new optical parametric generator based system able to reliably produce nearly transform-limited picosecond pulses at usefully high energy levels, with even higher output beam quality than its predecessor invention and having enhanced coarse and fine wavelength tuning capability.

A unique discovery of the predecessor to the present invention is that significantly increasing the energy level of a seed laser for an Optical Parametric Generator (OPG) results in OPG pulse signals that can be significantly amplified in a pulsed dyed amplifier (PDA) stage while retaining a desirable near-transform limited pulse shape and allowing for fine tuning of the order of approximately 50 GHz.

A unique discovery of the present invention is that adding a spatial filter system at the output of an OPG stage and replacing the iris in the PDA stage provides both higher output beam quality and enhanced coarse and fine wavelength tuning.

A particular advantage of both the present and predecessor OPG-PDA systems is that they can operate at a repetition rate of 10 Hz, allowing putting significantly more power into each pulse.

Another advantage of the present and predecessor OPG-PDA systems are that their high power output, particularly coupled with their reliability and robustness, allows them to be used for many more applications than prior art lower power lasers.

A further advantage of such OPG-PDA systems is that they can be coupled with an optical fiber, allowing an even greater variety of additional applications not possible with the prior art.

Accordingly, the invention is directed to a picosecond optical parametric generator, comprising an optical parametric generator stage having an output; a pulsed dye amplifier stage having an input and first and second dye cells, a spatial filter between the optical parametric generator stage output and the pulsed dye amplified stage input, an about 100 μm pinhole between the first and second dye cells, and a tunable high-power laser for injection-seeding the optical parametric generator stage, the high-power laser capable of a power output greater than about 100 mW.

DETAILED DESCRIPTION

Additional details of the work described in this description are in Paul S. Hsu, Sukesh Roy and James R. Gord, "Development of a Nearly Transform-Limited, Low-Repetition-Rate, Picosecond Optical Parametric Generator," Optics Communications, vol. 281, pp. 6068-6071 (Oct. 1, 2008 [online]), a copy of which is included as part of the cross-referenced provisional patent application incorporated by reference into this description.

As described earlier, the present invention improves on the original Nearly Transform-Limited, Low-Repetition-Rate, Picosecond Optical Parametric Generator by adding a spatial filter system between the OPG stage output and the PDA stage input; and, by replacing the iris in the PDA stage with a narrow pinhole (~100 μm) to block ASE. These improvements significantly increase the high output beam quality and coarse and fine wavelength tuning capability.

Figure 1:
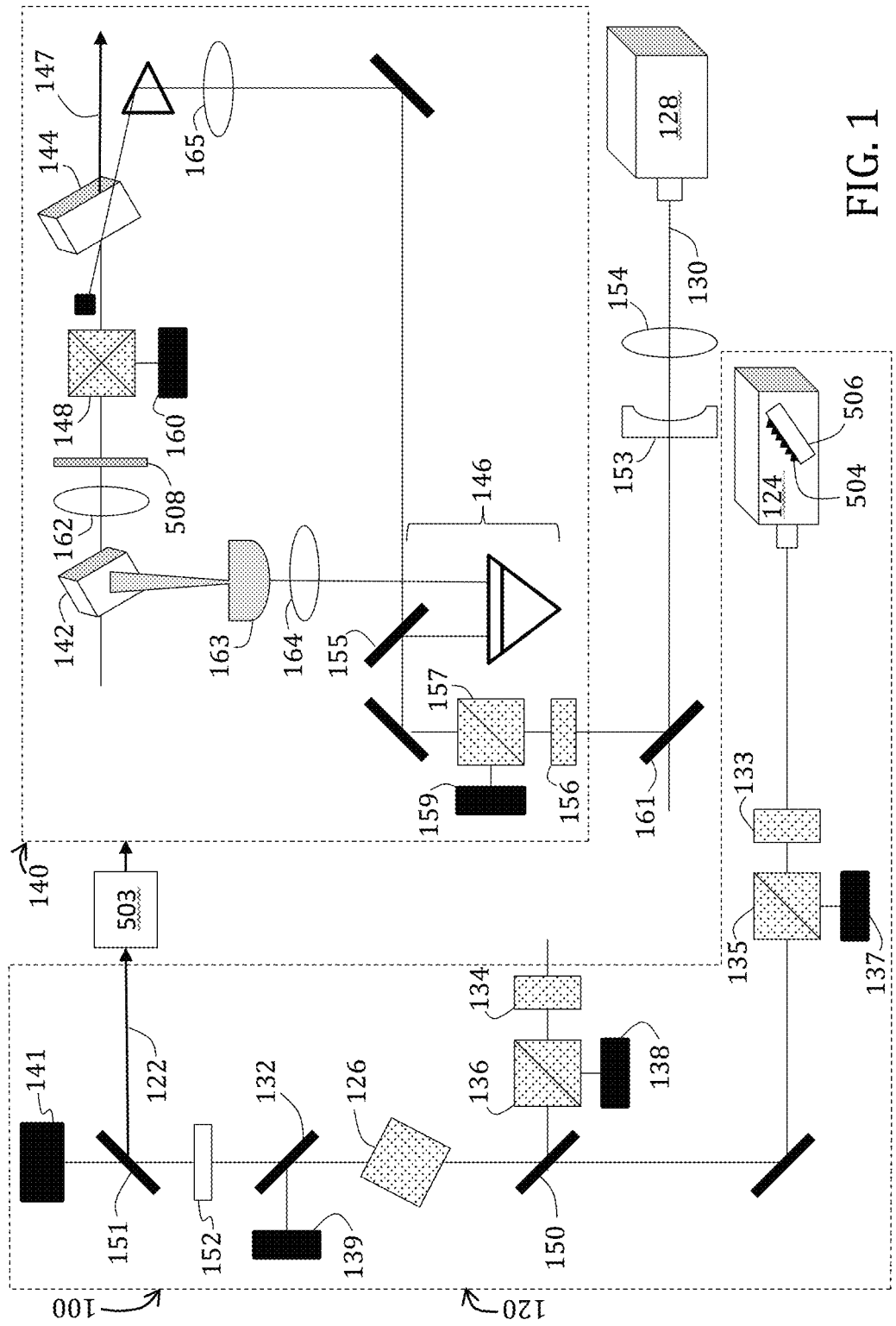
FIG. 1 is a schematic diagram of an example embodiment of an OPG-PDA system, or apparatus, according to the teachings of the present invention.

FIG. 1 is a schematic diagram of an example embodiment of an improved OPG-PDA system 100 according to the teachings of the present invention. OPG-PDA system 100 comprises two stages, an OPG stage 120, where a tunable, nearly transform-limited picosecond pulse 122 is produced, and a pulsed dye amplifier (PDA) stage 140, where OPG signal pulse 122 is amplified.

The present invention adds a spatial filter 503 between OPG stage 120 and PDA stage 140. The spatial filter 503 removes multiple-order energy peaks to produce a beam with a smoother intensity profile, ideally passing only the central maximum of the beam pattern to produce a so-called "clean Gaussian beam." The spatial filter 503 typically comprises a microscope objective, a pinhole aperture and a positioning mechanism.

Among other components described later in this description, OPG stage 120 includes a tunable seed laser 124 and a seeded β-BBO crystal 126.

Figure 2:
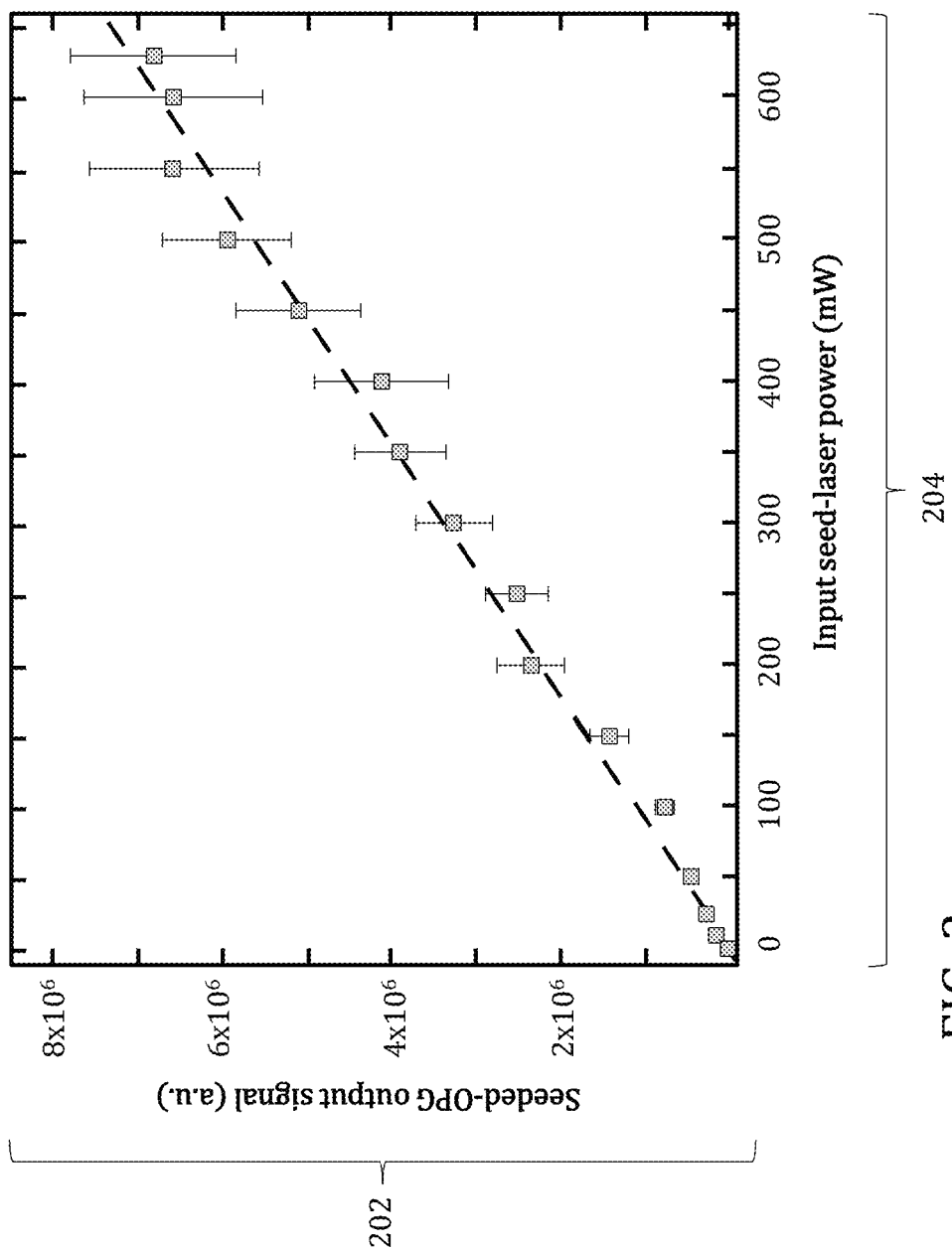
FIG. 2 is a graph of the intensity of signal output from a seeded BBO crystal as a function of seed laser power.

FIG. 2 is a graph of the intensity 202 of an OPG signal output from seeded β-BBO crystal 126 as a function of power output 204 from seed laser 124, demonstrating a key feature of the predecessor and present invention.

The prior art typically uses 10-mW seed power for a nanosecond laser-based optical parametric oscillator (OPO) or optical parametric amplifier (OPA) system. As shown in FIG. 2, such low seed power is not sufficient to assist the parametric process in a single pass through a nonlinear crystal. FIG. 2 shows that with an intense seed laser, the OPG signal increases by more than two orders of magnitude when the seed-laser power is increased from 10 mW to 630 mW. This shows that effective parametric gain for a picosecond single-pass OPG can be achieved only with a substantial flux of seed photons. The OPG signal shows a linear dependence on seed-laser power; however, for seed-laser powers greater than 550 mW, the signal begins to saturate.

Until the predecessor to the present invention, the prior art assumed that producing nearly transform-limited picosecond pulses using a single path optical parametric generator could not be done.

Returning now to FIG. 1, a Nd:YAG laser 128 (EKSPLA SL300) at 355 nm is used to pump OPG stage 120 and PDA stage 140 with a beam 130 having a pulse energy of ~90 mJ. The repetition rate and the pulse width of pump laser 128 at 355 nm are 10 Hz and ~150 picoseconds. The Nd:YAG output 130 is nearly transform-limited (single-longitudinal-mode oscillator) and has excellent top-hat beam quality. In this example embodiment, generations of OPG signal radiation with ~1 μJ/pulse from injection-seeded β-BBO crystal 126 were demonstrated using 17-mJ pump laser 128 and seed laser 124. Tunable seed laser 124 is a 630-mW external cavity diode laser (ECDL) (Sacher Lasertechnik TEC-300-960-500) providing a continuous-wave (CW) seed source at an idler wavelength of ~950 nm. In this example configuration, seed laser 124 is a Littrow configuration laser including a diffraction grating 504 as an end mirror and a piezo actuator, or transducer 506, for modifying cavity length, generally mounted beneath grating 504. Injection seeding at the idler wavelength for OPG avoids spectrum interference in the later amplification processes. The spectral component at the idler frequency is blocked ahead of PDA stage 140 by a dichroic mirror 132. The observed OPG output signal 122 is well-shaped and does not contain the component of seed laser 124. To match the beam size of seed laser 124, the pump beam 130 is down-collimated to a 2-mm diameter in BBO crystal 126. BBO crystal 126 is cut at an angle of 30 degrees to the optical axis. The crystal length is 10 mm and the faces are 8 mm square in cross section (normal to the beam-propagation direction) with $MgF_2$ protective coatings. To minimize thermal fluctuations, BBO crystal 126 is installed in a temperature-controlled crystal holder. The maximum energy out of the injection-seeded OPG signal at ~566 nm is only a few μJ.

OPG stage 120 of this example embodiment of an OPG-PDA system according to the teachings of the present invention further comprises half-wave plates 133, 134; polarizers 135, 136; beam dumps 137, 138, 139, 141; dichroic mirrors 150, 151 an interference filter 152; a 50 mm focal length lens 153; a 200 mm focal length lens 154; and a beam splitter 161.

For amplification, after passing through spatial filter 503, OPG signal 122 is injection-seeded into first and second dye cells 142, 144 that are side-pumped and end-pumped by a portion of 355-nm laser beam 130. The temporal overlap between the OPG signal photons and the ~150-picosecond pump beam in first dye cell 142 is achieved using a delay stage 146. Second dye cell 144 is end-pumped to improve the spatial profile of the beam. To reduce amplification of the amplified spontaneous emission (ASE) in second dye cell 144, a pinhole 508 (~100 μm) and a polarizer 148 are placed after first dye cell 142 to filter most of the ASE generated from first dye cell 142. In this example embodiment, Rhodamine 590 dye is used to amplify the OPG beam at ~566 nm. OPG signal 122 is amplified by more than three orders of magnitude through the first and second dye cells 142, 144 to produce a final output signal 147.

PDA stage 140 further comprises a beam splitter 155; a half-wave plate 156; polarizers 148, 157; beam dumps 159, 160; a 250 mm focal length lens 162; a 250 mm focal length lens 163; a 250 mm focal length lens 164; and a 500 mm focal length lens 165.

As described in the cross-referenced provisional application and Optics Communications paper, the pulse duration of the amplified OPG pulses was measured using a multi-shot scanning autocorrelator (EKSPLA AC532/1064). The average autocorrelation-pulse profile of the amplified OPG signal 147 as shown in FIG. 2 of the Optics Communications paper corresponds to a temporal pulse width of ~168 ps. The spectral profile of OPG signal 147, shown in FIG. 3(a) of the Optics Communications paper, was measured with an Ocean Optics spectrometer (Model USB4000). The full width at half maximum (FWHM) value of the unseeded and seeded OPG signals was observed to be ~5 nm and ~0.02 nm, respectively, with a resolution ~0.02 nm. The limited spectral resolution of the spectrometer prevented full resolution of the linewidth of the seeded OPG signal. As described in the Optics Communications paper, a solid etalon with FSR of 33 GHz and finesse of 330 was used to accurately determine the bandwidth of OPG signal as 8.32±0.648 GHz. The linewidth is approximately a factor of two broader than the linewidth of the pump beam 130, which was measured to be 4.37±0.8 GHz. The output energy of ~1 μJ/pulse OPG signal 122 was successfully amplified to ~2.3 mJ/pulse using pulsed first and second dye amplifiers 142, 144. Pulsed dye amplifier 142 was side-pumped with ~22 mJ/pulse energy and pulsed dye amplifier 144 was end-pumped with ~33 mJ/pulse energy.

Figure 3:
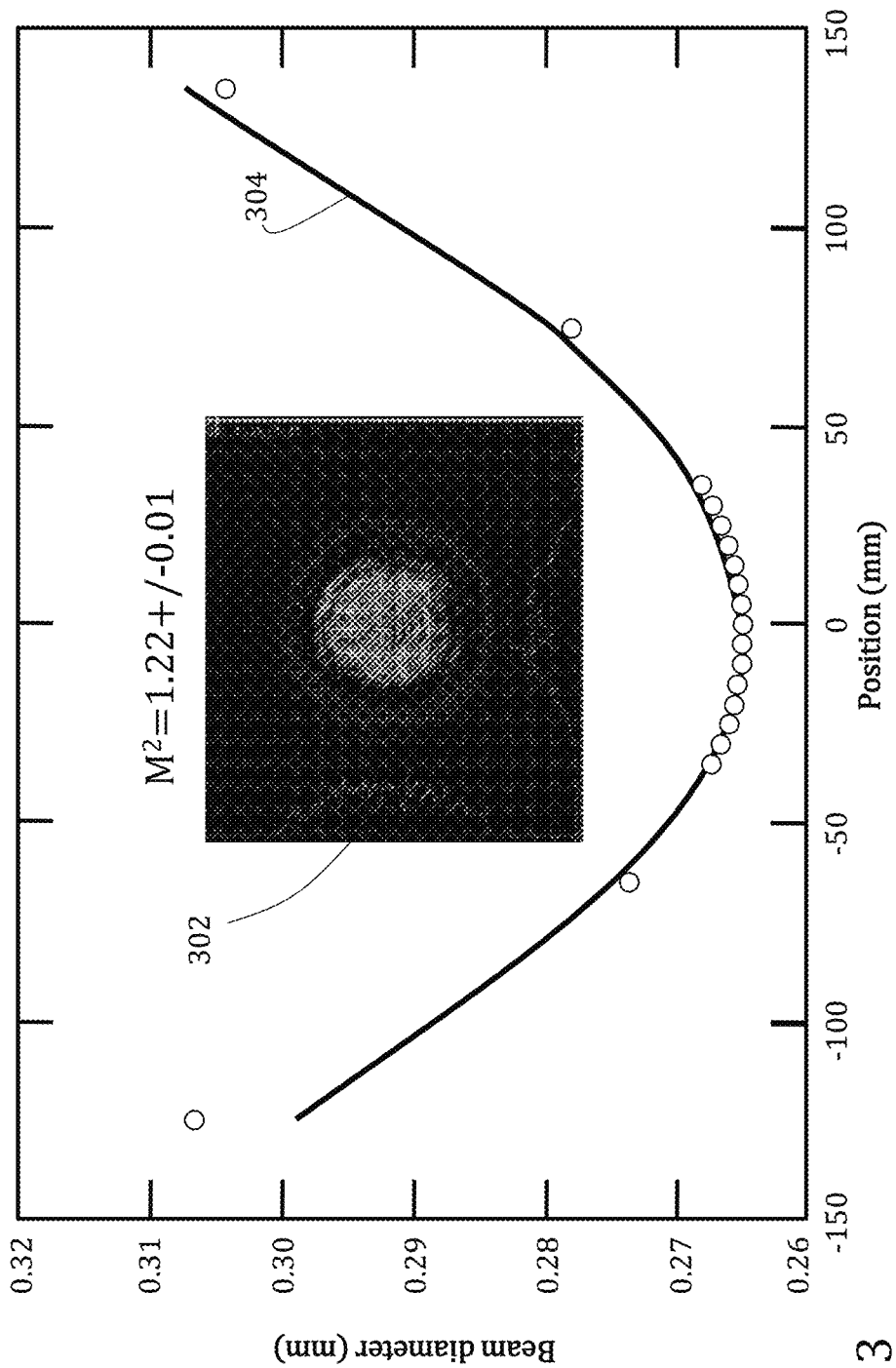
FIG. 3 is a graph of the measured beam-quality factor $M^2$ of an OPG-PDA system according to the teachings of the present invention.

FIG. 3 is a graph of the measured beam-quality factor $M^2$ of the OPG output. Insert 302 denotes experimental data and solid line 304 is a theoretical fit to determine $M^2$ value. The graph shows $M^2$=1.22, which is similar to a typical Nd:YAG laser beam quality. FIG. 3 also shows output OPG beam profile 302 at its focus, demonstrating an excellent, nearly top-hat, spatial mode. Such a beam profile is ideal for planar laser-based techniques such as planar-laser-induced fluorescence (PLIF) and particle image velocimetry (PIV).

The improved OPG system also allows wavelength tuning in both coarse (up to ~3 nm) and fine (fine tuning resolution ~0.001 nm) wavelength regimes, making it ideal for high-resolution molecular spectroscopy. Coarse wavelength tuning can be achieved either by changing seed-laser temperature or the tuning angle of seed laser grating 504. Fine wavelength tuning is achieved by varying the piezo 506 voltage of seed laser 124.

Figure 4:
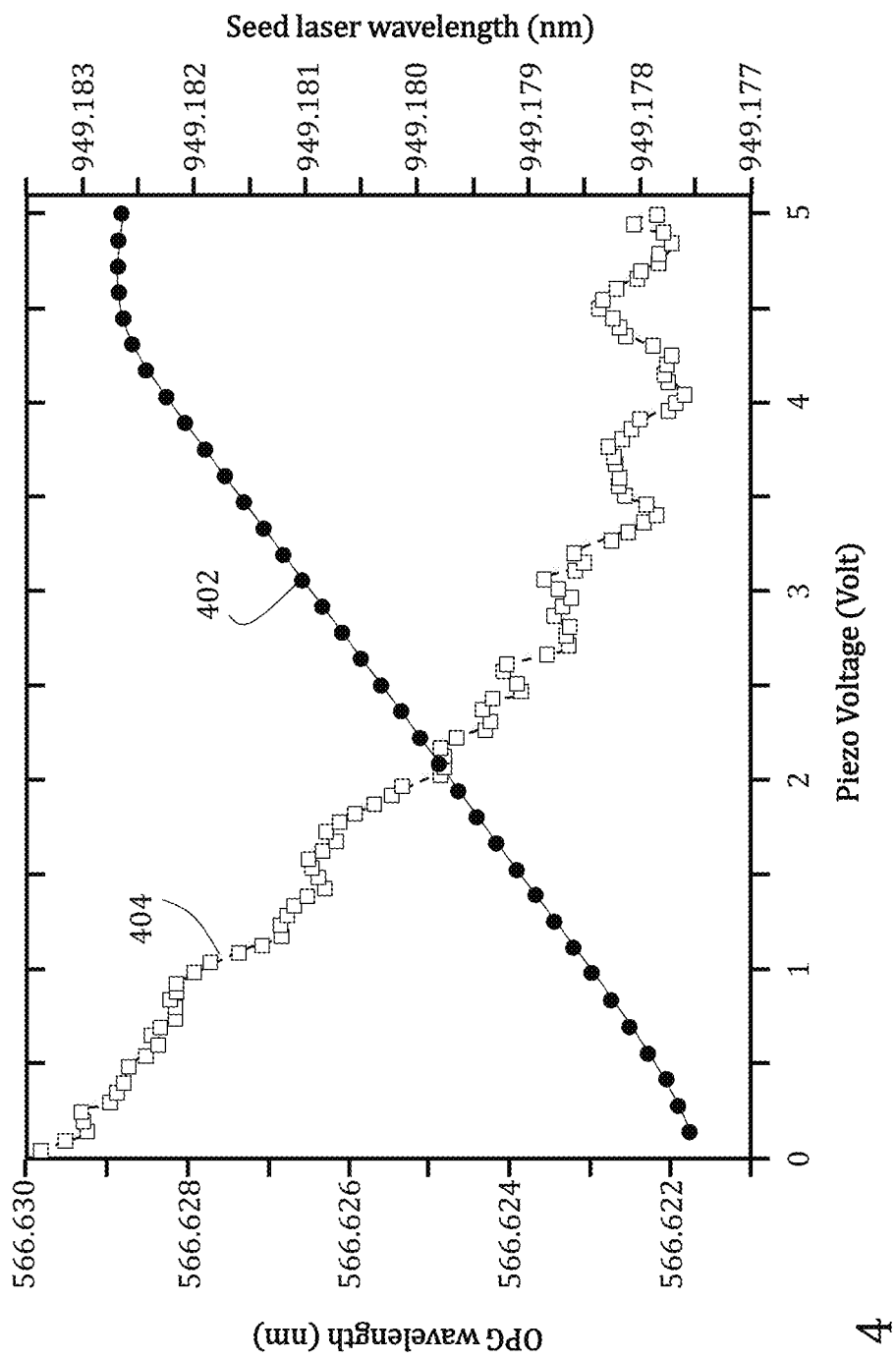
FIG. 4 is a graph of OPG and seed laser wavelengths as a function of seed-laser piezo voltage for an OPG-PDA system according to the teachings of the present invention.

FIG. 4, a graph of OPG and seed laser wavelengths 402 as a function of seed-laser 506 piezo voltage, shows the capability of fine detuning of OPG wavelength 404 by seed-laser piezo 506 voltage.

The disclosed new and improved approach for a tunable picosecond (ps) optical parametric generator-based system successfully demonstrates the use of higher power input stages to produce unexpectedly higher output energies. Although the disclosed example embodiments are specialized, their teachings will find application in related areas where higher energy outputs are needed in more compact and more robust systems than are currently found in the prior art.

Various modifications to the invention as described may be made, as might occur to one with skill in the art of the invention, within the scope of the claims. Therefore, all contemplated embodiments have not been shown in complete detail. Other embodiments may be developed without departing from the spirit of the invention or from the scope of the claims.

We claim:

1. A picosecond optical parametric generator, comprising:
    (a) an optical parametric generator stage having an output;
    (b) a pulsed dye amplifier stage having an input and first and second dye cells;
    (c) a spatial filter between the optical parametric generator stage output and the pulsed dye amplified stage input;
    (d) an about 100 μm pinhole between the first and second dye cells; and,
    (e) a tunable high-power laser for injection-seeding the optical parametric generator stage, the high-power laser capable of a power output greater than about 100 mW.

* * * * *